(12) United States Patent
Ren et al.

(10) Patent No.: US 8,283,748 B2
(45) Date of Patent: Oct. 9, 2012

(54) LOW LOSS SUBSTRATE FOR INTEGRATED PASSIVE DEVICES

(75) Inventors: Xiaowei Ren, Phoenix, AZ (US); Wayne R. Burger, Phoenix, AZ (US); Colin Kerr, South Lanarkshire (GB); Mark A. Bennett, Glasgow (GB)

(73) Assignee: Freescale Semiconductors, Inc., Austin, TX (US)

( * ) Notice: Subject to any disclaimer, the term of this patent is extended or adjusted under 35 U.S.C. 154(b) by 0 days.

(21) Appl. No.: 13/277,847

(22) Filed: Oct. 20, 2011

(65) Prior Publication Data

US 2012/0038023 A1    Feb. 16, 2012

Related U.S. Application Data

(62) Division of application No. 12/328,325, filed on Dec. 4, 2008, now Pat. No. 8,071,461.

(51) Int. Cl.
*H01L 21/70* (2006.01)
(52) U.S. Cl. .................. 257/506; 257/E29.02
(58) Field of Classification Search .................. 257/506, 257/E29.02
See application file for complete search history.

(56) References Cited

U.S. PATENT DOCUMENTS

| | | |
|---|---|---|
| 4,139,442 A | 2/1979 | Bondur et al. |
| 5,190,889 A | 3/1993 | Poon et al. |
| 5,217,919 A | 6/1993 | Gaul et al. |
| 5,504,033 A | 4/1996 | Bajor et al. |
| 5,933,746 A | 8/1999 | Begley et al. |
| 6,271,100 B1 | 8/2001 | Ballantine et al. |
| 6,790,751 B2 | 9/2004 | Tsuruta et al. |
| 7,087,925 B2 | 8/2006 | Grivna |
| 7,250,669 B2 | 7/2007 | Chan et al. |
| 7,276,425 B2 | 10/2007 | Averett et al. |
| 7,326,625 B2 | 2/2008 | Jeong et al. |
| 2003/0062588 A1 | 4/2003 | Grivna |

*Primary Examiner* — Zandra Smith
*Assistant Examiner* — Marvin Payen
(74) *Attorney, Agent, or Firm* — Ingrassia Fisher & Lorenz, P.C.

(57) ABSTRACT

Electronic elements having an active device region and integrated passive device (IPD) region on a common substrate preferably include a composite dielectric region in the IPD region underlying the IPD to reduce electro-magnetic (E-M) coupling to the substrate. Mechanical stress created by plain dielectric regions and its deleterious affect on performance, manufacturing yield and occupied area may be avoided by providing electrically isolated inclusions in the composite dielectric region of a material having a thermal expansion coefficient (TEC) less than that of the dielectric material in the composite dielectric region. For silicon substrates, non-single crystal silicon is suitable for the inclusions and silicon oxide for the dielectric material. The inclusions preferably have a blade-like shape separated by and enclosed within the dielectric material.

20 Claims, 8 Drawing Sheets

LOW LOSS SUBSTRATE FOR INTEGRATED PASSIVE DEVICES

RELATED APPLICATION

This application is a divisional of co-pending, U.S. patent application Ser. No. 12/328,325, filed on Dec. 4, 2008.

FIELD OF THE INVENTION

The present invention generally relates to semiconductor (SC) devices and integrated circuits (ICs) and their methods of manufacture, and more particularly, structures and methods for providing SC devices and ICs embodying low loss integrated passive devices on a common substrate.

BACKGROUND

A need continues to grow for more complex semiconductor (SC) devices and integrated circuits (IC) incorporating integrated passive devices. Non-limiting examples of such passive devices are inductors, capacitors, resistors, interconnections, transmission lines, baluns, couplers, filters, various other high frequency components, and so forth. For manufacturing and performance efficiency it is advantageous to form the passive devices on the same substrate as the transistors and/or other active devices used to implement the desired electronic function. Hence, the description "integrated passive devices", abbreviated as "IPD".

The performance and cost of many devices, especially radio frequency (RF) power devices and integrated circuits (ICs), are particularly sensitive to losses and layout rules associated with such integrated passive devices and to their occupied area. Electro-magnetic (E-M) coupling of IPDs to the semiconductor substrates on which they are formed can give rise to eddy current losses in the substrate that can degrade overall device and IC performance. These problems become more severe with high periphery and higher frequency devices. When the IPDs incorporate resonant elements (e.g., inductors, capacitors, transmission lines, filters, etc.) the E-M coupling between such IPDs and the underlying semiconductor substrate can degrade the "Q" of the IPDs and result in significant overall circuit losses. (The quality factor Q is a measure of the energy stored divided by the energy dissipated per cycle by a resonant element). Such losses can occur with any type of integrated passive device, not just those listed above. Another concern is the area occupied by the IPDs and the connections leading thereto. If forming the IPDs interacts adversely with the associated active devices, this can require larger minimum separation between the active devices and the IPDs. When that occurs, the performance can be further degraded because of the increase in coupling losses associated with longer interconnections. Further, the overall manufacturing cost also increases in proportion to the increase in total occupied area. Thus, any adverse interactions between the IPDs and associated active devices that leads to increased element spacing, greater coupling losses and larger chip area is undesirable.

Accordingly, a need continues to exist for improved device structures and fabrication methods, that reduce the parasitic E-M coupling and losses associated with integrated passive devices (IPDs) formed on the same substrate as their associated transistors and other active devices. It is also important that inter-element spacing associated with placing the IPDs on the same substrate as the active devices be minimized so as to avoid area bloat and/or further coupling losses associated with increased separation between the active devices and the IPDs.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
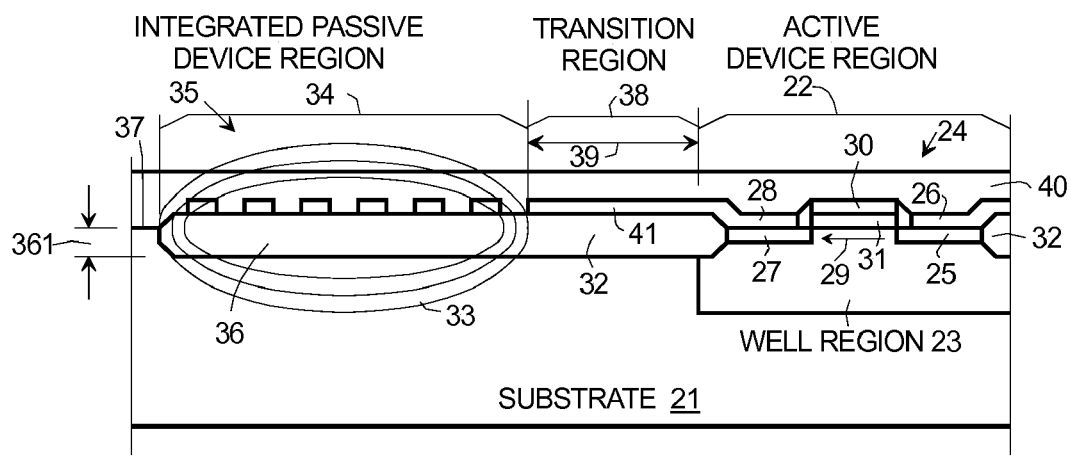
FIG. 1 shows a cross-sectional view through an electronic element comprising a field effect transistor (e.g., a MOSFET) in an active device region (ADR) and an integrated passive device (IPD) (e.g., an inductor) in an adjacent IPD region on a common semiconductor substrate, according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting, semiconductor-on-insulator (SOI) structures, and combinations thereof. The term "semiconductor" is abbreviated as "SC." The terms "wafer" and "substrate", singular or plural, are intended refer to supporting structures that are relatively thin compared to their lateral surface area and used in connection with batch fabrication of electronic devices. Non-limiting examples of such wafers and substrates include: semiconductor wafers, SOI wafers, and other types of supporting structures in or on which active and passive electronic devices are fabricated or that are used in connection with the fabrication of such devices.

For convenience of explanation and not intended to be limiting, electronic structures (e.g., active and passive devices and elements and combinations thereof) and methods of fabrication of the various embodiments of the present invention are described herein for silicon semiconductors and dielectrics formed of silicon oxides, but persons of skill in the art will understand that other semiconductor and dielectric materials can also be used. Also, for convenience of explanation, active devices in the form of lateral diffused metal-oxide-semiconductor (LDMOS) transistors and regular metal-oxide-semiconductor-field-effect-transistor (MOSFET) devices are illustrated, but this is not intended to be limiting and persons of skill in the art will understand that any type of active device may be used and that the term metal-oxide-semiconductor (and the abbreviation MOS) in connection with any such devices is not limited merely to oxide gate dielectrics and/or metal conductors but includes any type of insulating dielectric (organic or inorganic) in place of "oxide" and any type of conductor (organic or inorganic) in place of "metal" in such devices. The terms "dielectric" and "insulator" or "insulating" are used interchangeably herein, that is, a dielectric is presumed to be an insulator or insulating, and vice-versa.

Figure 2:
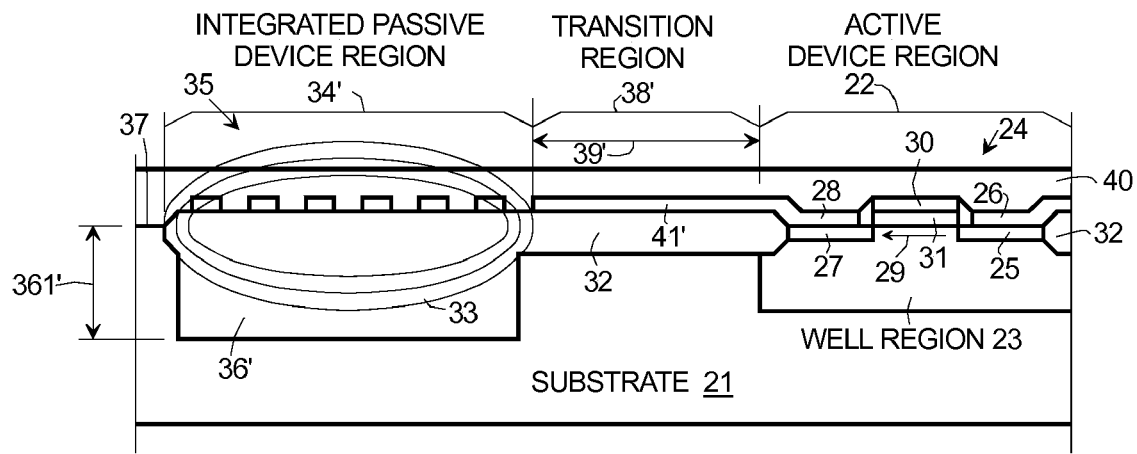
FIG. 2 shows a cross-sectional view through a further electronic element comprising a field effect transistor (e.g., a MOSFET) in an active device region (ADR) and an integrated passive device (IPD) (e.g., an inductor) in an adjacent IPD region incorporating a relatively deeper dielectric region (DDR) underlying the IPD, on a common semiconductor substrate.

FIGS. 1-2 show cross-sectional views through electronic element 20, 20' comprising, by way of example, field effect transistor 24 in active device region 22 and integrated passive device (IPD) 35 (e.g., an inductor) in IPD region 34 on common semiconductor substrate 21, separate by transition region 38 of length 39, 39'. FIG. 1 is according to the prior art. Substrate 21 is conveniently of silicon. Metal-oxide-semiconductor field effect transistor (MOSFET) 24 is formed in active device region 22 of substrate 21 in the conventional manner. Doped well region 23 provided in substrate 21 contains source-drain (or drain-source) regions 25, 27 with contacts 26, 28 respectively. Gate oxide 31 surmounted by control gate 30 overlies channel region 29 just beneath substrate surface 37 between source-drain regions 25, 27. Thicker field oxide regions 32 are provided in surface 57 of substrate 21. Spiral IPD inductor 35, shown in cross-section in FIGS. 1-2, is formed on portion 36, 36' of field oxide region 32 in integrated passive device (IPD) region 34, 34' on substrate 21. Passivation layer 40 is conventionally provided over electronic element 20, 20' of FIGS. 1-2.

IPD inductor 35 can create significant electro-magnetic (E-M) coupling field 33 extending toward and into substrate 21. This E-M coupling field between IPD inductor 35 and substrate 21 can degrade the "Q" of IPD inductor 35 and result in significant circuit losses. To reduce the E-M coupling field and the losses produced thereby, thickness 361 of portion 36 of field oxide region 32 of FIG. 1 is increased in electronic element 20' of FIG. 2 to form deep (e.g., ≧10 micrometers) oxide or dielectric region (DDR) 36' of thickness 361'. While having deep oxide region 36' underlying IPD region 34' in FIG. 2 can reduce the substrate E-M coupling losses associated with IPD 35, it can also interact adversely with device 24 in nearby active device region 22, thereby limiting overall circuit performance. In order to minimize such adverse impact, IPD region 34' can be spaced further away from device region 22. But this reduces the integrated packing density and increasing the overall circuit area. Such area increase ("area bloat") is undesirable. Further, formation of relatively deep oxide dielectric region (DDR) 36' can adversely affect manufacturing yield, thereby increasing overall cost. This is also undesirable. These adverse effects become more severe as the operating frequency and/or output power increase. Accordingly, a need continues to exist for an electrically functional equivalent of deep dielectric region (DDR) 36' in IPD region 34' with: (i) little or no adverse impact on transistors or other devices in nearby active device region (ADR) 22, (ii) improved or at least no adverse impact on overall circuit performance, and/or (iii) improved or at least no adverse impact on manufacturing yield and cost.

Figure 3:
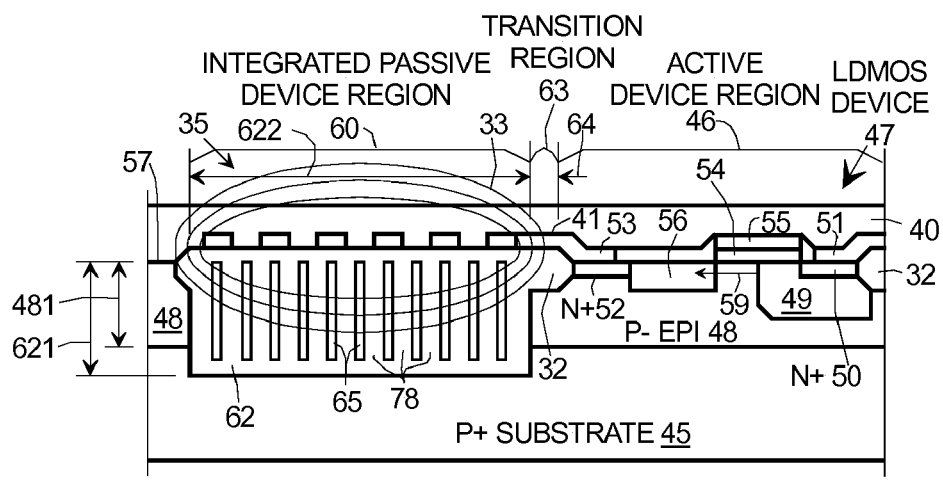
FIG. 3 shows a cross-sectional view through an electronic element comprising, by way of further example, a laterally diffused metal-oxide-semiconductor (LDMOS) device in an active device region (ADR) and an integrated passive device (IPD) (e.g. an inductor) in an adjacent IPD region incorporating a composite dielectric region (CDR) underlying the IPD, on a common semiconductor substrate, according to an embodiment of the present invention.
Figure 4:
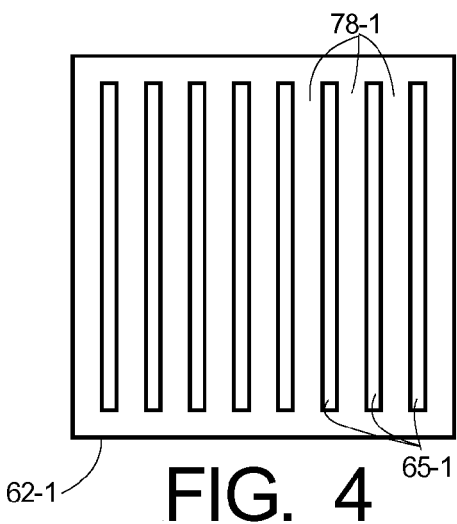
FIGS. 4-11 show simplified plan views of various composite dielectric regions (CDRs) suitable for use in the electronic element of FIG. 3, according to further embodiments of the present invention.
Figure 5:
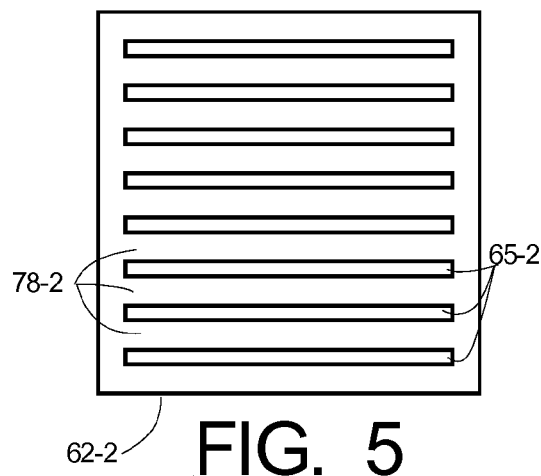
Figure 6:
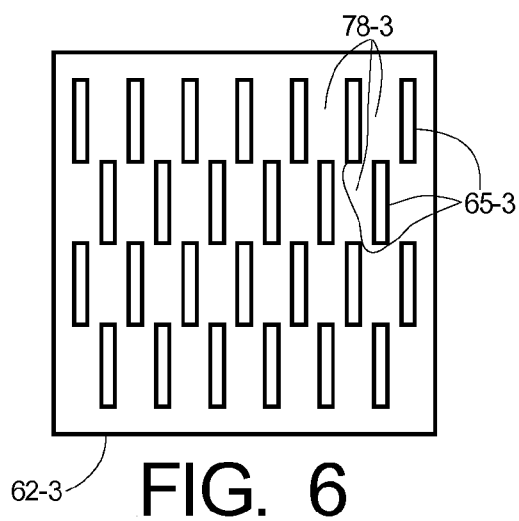
Figure 7:
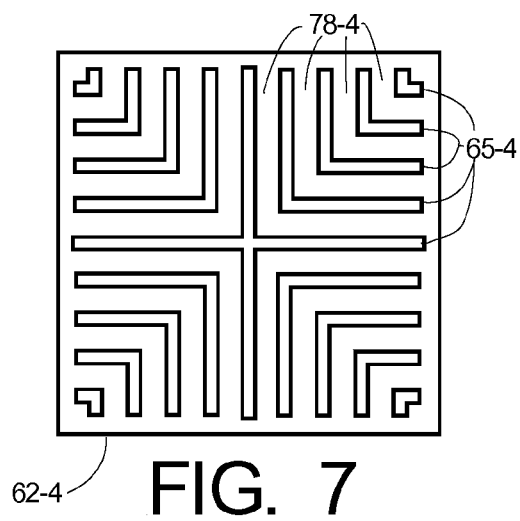
Figure 8:
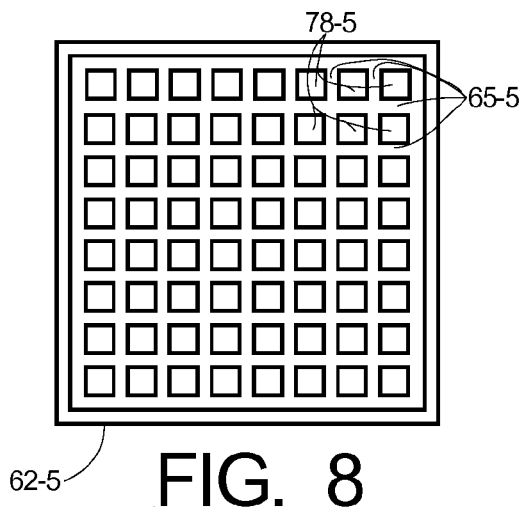
Figure 9:
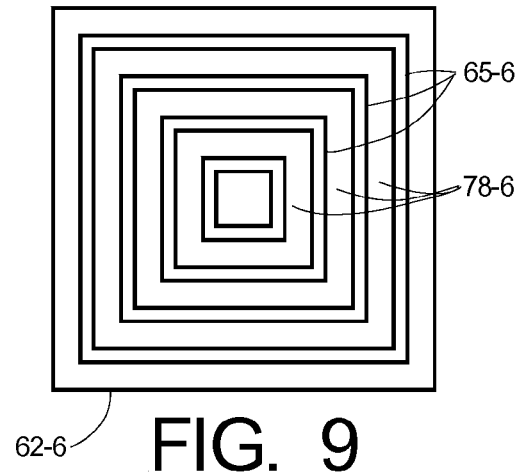
Figure 10:
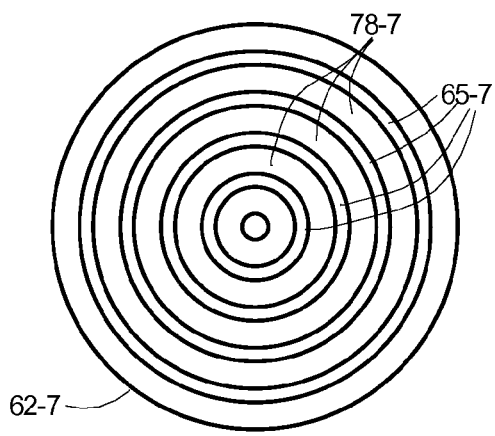
Figure 11:
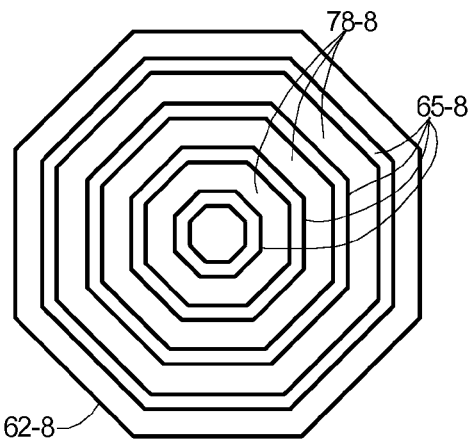

FIG. 3 shows a cross-sectional view through electronic element 44 comprising, by way of example, LDMOS transistor or device 47 in active device region 46 and integrated passive device (IPD) 35 (e.g. an inductor) in adjacent IPD region 60 on common semiconductor substrate 45, according to an embodiment of the present invention. For convenience of description and not intended to be limiting, substrate 45 is assumed to be a P+ silicon substrate with, in a preferred embodiment, P− epi-layer 48 of thickness 481 extending to upper SC surface 57. However, in other embodiments, layer 48 may be omitted or provided by any desired means. Active device region 46 is separated from IPD region 60 by transition region 63 of width 64. Exemplary LDMOS transistor 47, comprises P-type region 49 (e.g., somewhat more heavily doped than epi-region 48) in which is located N+ source region 50 adjacent SC surface 57. More lightly doped N-type drift region 56 and heavily doped N+ drain region 52 are also located in P− epi-region 48 adjacent SC surface 57. Gate dielectric 54 and gate 55 overlie channel region 59 between source region 50 and drift region 56. LDMOS transistor 47 is conventional. It is common to also provide a P+ sinker region (not shown) extending from source 50 through P– epi-layer 48 to P+ substrate 45 to provide electrical connection thereto. IPD 35 in IPD region 60 overlies composite dielectric region (CDR) 62 of depth 621 and lateral dimension 622 parallel to the plane of FIG. 3. Lateral dimension 622 is chosen by the designer to accommodate IPD 35 placed over composite dielectric region (CDR) 62. Depth 621 of CDR 62 should be sufficient to substantially contain significant E-M field 33 generated by IPD 35 during circuit operation or at lest mitigate its significant interaction with substrate 45. In most cases, depth 621 is usefully equal or greater than about 5 micrometers, more conveniently equal or greater than about 10 micrometers and preferably equal or greater than about 15 micrometers.

It has been found that the adverse circuit loss, the adverse manufacturing yield impact and the adverse layout density (area bloat) impact associated with dielectric region 36' of FIG. 2 can be ameliorated or avoided by providing composite dielectric region (CDR) 62 underlying IPD 35 of FIG. 3, wherein CDR 62 includes multiple electrically floating rod-like or blade-like poly-crystalline or amorphous (i.e., non-single crystalline) regions or inclusions 65, separated from each other by dielectric (e.g. oxide) portions 78. With silicon substrates 45, polysilicon is a suitable material for inclusions 65, but other materials can also be used in other embodiments. Tests show that the structure of FIG. 2 with DR 36' supporting IPD 35 creates significant mechanical stress in substrate 21 and that this stress adversely affects the manufacturing yield, the properties of active devices in nearby ADR 22 and requires a significant transition region 38' between IPD region 34' and ADR 22 thereby increasing overall circuit area (i.e., causing "area bloat"). It has been found that the structure illustrated in FIG. 3 does not create these undesirable stresses in substrate 45 and thereby minimizes or avoids the adverse impact on manufacturing yield, coupling losses, device properties and area bloat arising from such stress. The stress present in substrate 45 and adjacent active device region (ADR) 46 of electronic element 44 of FIG. 3 incorporating composite dielectric region (CDR) 62 is much reduced compared to that present in prior art element 20' of FIG. 2 incorporating deep dielectric region 36'. Thus, element 44 comprising substrate 45 with CDR 62 under IPD region 60 and with adjacent ADR 46 of FIG. 3, not only exhibits superior performance characteristics by virtue of the reduced E-M coupling from IPD 35 to substrate 45 but also avoids the excessive manufacturing yield loss, area bloat and increased coupling losses associated with the arrangements of FIG. 2. It has been found that the manufacturing yield associated with the structure of element 44 of FIG. 3, is significantly greater than the manufacturing yield associated with an otherwise identical element 20' of FIG. 2. (In this test substantially identical LDMOS devices were formed in active device regions 22 and 46). It is further found that width 64 of transition region 63 can be made much smaller in connection with CDR 62 without adverse effect, whereas, substantially larger transition region 38' of FIG. 2 has to be provided between IPD region 34' and active device region 22 of element 20' in order to reduce the impact of the stress created by DDE 36' on active device region 22. Thus, the adverse impact on circuit packing density of DDE 36' is also avoided. In summary, by using the structure of FIG. 3: (i) E-M coupling loss is reduced, (ii) overall circuit efficiency is improved, (iii) substrate stress and its adverse impact on active device properties is minimized or avoided, and (iv) IPD region 60 can be placed closer to active device region 46, thereby avoiding further coupling losses and the loss of circuit packing density (area bloat) otherwise encountered with the arrangement of FIG. 2. These beneficial effects are highly desirable and a significant advance in the art.

FIGS. 4-11 show simplified plan views of various composite dielectric regions (CDRs) 62-1 ... 62-8 (collectively 62) containing electrically floating polycrystalline or amorphous inclusions 65-1 ... 65-8 (collectively 65) laterally separated by dielectric region 78-1 ... 78-8 (collectively 78) and suitable for use in improved integrated passive device (IPD) region 60 of integrated electronic element 44 of FIG. 3, according to further embodiments of the present invention. As explained in connection with FIGS. 12-20, inclusions 65 are generally formed in trenches and in plan view the inclusions and trenches can have any of the layout arrangements illustrated in FIGS. 4-11. Inclusions 65 may be arranged in substantially parallel rows 65-1, 65-2 separated by dielectric regions 78-1, 78-2 as illustrated for example in FIGS. 4-5, or in substantially parallel staggered rows 65-3 separated by dielectric regions 78-3 as illustrated for example in FIG. 6, or in "L" or "T" shaped arrangements 65-4 separated by dielectric regions 78-4 as illustrated for example in FIG. 7, or in a lattice-like X-Y arrangement 65-5 where the openings in the lattice correspond to dielectric regions 78-5 as illustrated for example in FIG. 8, or in concentric rectangles 65-6, circles 65-7 or polygons 65-8 separated by dielectric regions 78-6, 78-7, 78-8 respectively, as illustrated for example in FIGS. 9-11. Any of these arrangements are suitable and provided by way of example and not by way of limitation. Other two dimensional plan view arrangements of inclusions 65 may also be used.

FIGS. 12-20 show cross-sectional views though semiconductor substrate 45 at different stages 112-120 of manufacture of composite dielectric region (CDR) 62 of IPD region 60 of FIG. 3 adapted to support one or more integrated passive devices (IPDs) 35, according, to further embodiments of the present invention. In FIGS. 12-20, formation of CDR 62 is illustrated and conventional steps involved in the fabrication of active device(s) in adjacent ADR 46 are largely omitted. Hence, ADR 46 is not shown in FIGS. 12-19, but only included in FIG. 20. One or more active devices 47 (see FIG. 3) can be fabricated in ADR 46, before, during or after manufacturing steps 112-119 of FIGS. 12-19 and such fabrication is included in manufacturing stage 120 of FIG. 20 merely by way of example and not intended to be limiting.

Figure 12:
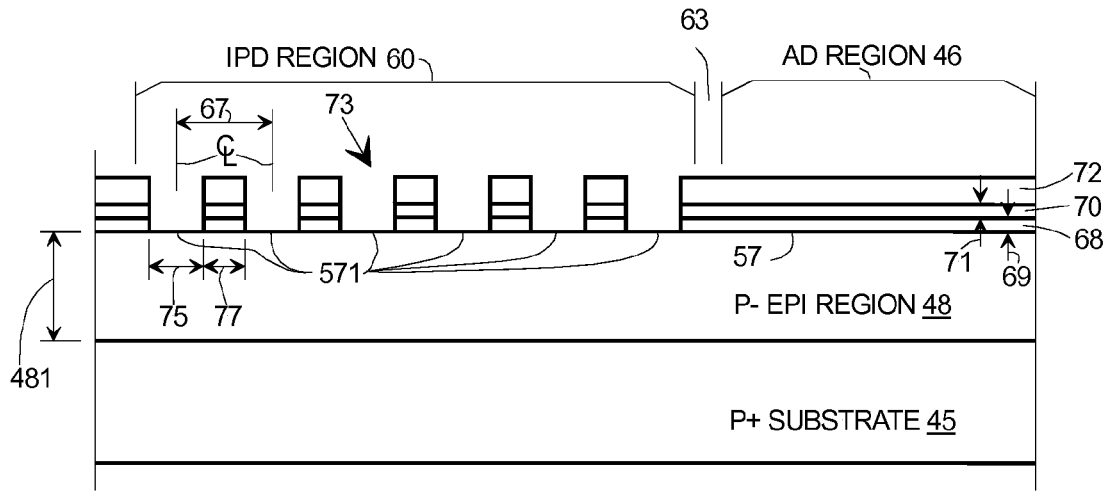
FIGS. 12-20 show cross-sectional views through a semiconductor substrate at different stages of manufacture of the composite dielectric regions (CDRs) of FIGS. 3 and 4-11, adapted to support one or more integrated passive devices (IPDs), according to still further embodiments of the present invention.

Referring now to manufacturing stage 112 of FIG. 12, in a preferred embodiment P+ silicon substrate 45 having surface 57 and upper, (e.g., epi) region 48 of, for example, lightly doped P-type silicon of thickness 481, is provided. Thickness 481 is usefully in the range of about 1 to 15 micrometers, more conveniently in the range of about 5 to 13 micrometers and preferably in the range of about 9 to 13 micrometers, but thicker and thinner layers can also be used and in other embodiments, upper region 48 may be omitted or provided by implantation or other doping means. Persons of skill in the art will understand that thickness 481 and the doping of region 48 depend upon the particular type of device being implemented in ADR 46 and that the thicknesses and doping levels given herein are merely by way of example and not intended to be limiting. For example, whether or not upper region 48 of thickness 481 and of the same or different doping than substrate 45 is needed will depend upon the type of devices the designer desires to form in ADR region 46 and is within the competence of those of skill in the art. Persons of skill in the art will also understand that description of a silicon substrate and P+ substrate doping in connection with FIGS. 12-20 (and FIGS. 21-28) is intended as an example of a preferred embodiment and not by way of limitation to the exclusion of other semiconductor materials and conductivity types. Initial pad layer 68 of thickness 69 chosen for its compatibility and differential etchability with SC substrate 45 is desirably provided on SC surface 57. Silicon oxide is a suitable material for initial pad layer 68 but other materials can also be used. Thickness 69 is usefully in the range of about 0.02 to 0.2 micrometers, more conveniently in the range of about 0.04 to 0.17 micrometers and preferably in the range of about 0.1 to 0.17 micrometers, but thicker and thinner layers can also be used. Further pad layer 70 of thickness 71 is provided on initial pad layer 68. Further pad layer 70 is chosen for its ability to resist chemical reactions such as oxidation of underlying SC substrate 45, its differential etchability with respect to underlying initial pad layer 68 and its usefulness as a planarization etch stop or polishing stop. Silicon nitride is a suitable material for further pad layer 70 but other materials can also be used. Thickness 71 is usefully in the range of about 0.02 to 0.2 micrometers, more conveniently in the range of about 0.04 to 0.17 micrometers and preferably in the range of about 0.1 to 0.15 micrometers, but thicker and thinner layers can also be used. Hard mask layer 72 is desirably provided on further pad layer 70. Silicon oxide formed, for example by chemical vapor deposition (CVD) using tetra-ethyl-ortho-silicate (TEOS) reactants, is a non-limiting example of a suitable material for hard mask 72, but other durable mask materials may also be used. Openings 73 are provided though hard mask layer 72, further pad layer 70 and initial pad layer 68, thereby exposing regions 571 of surface 57. Structure 212 results.

Figure 13:
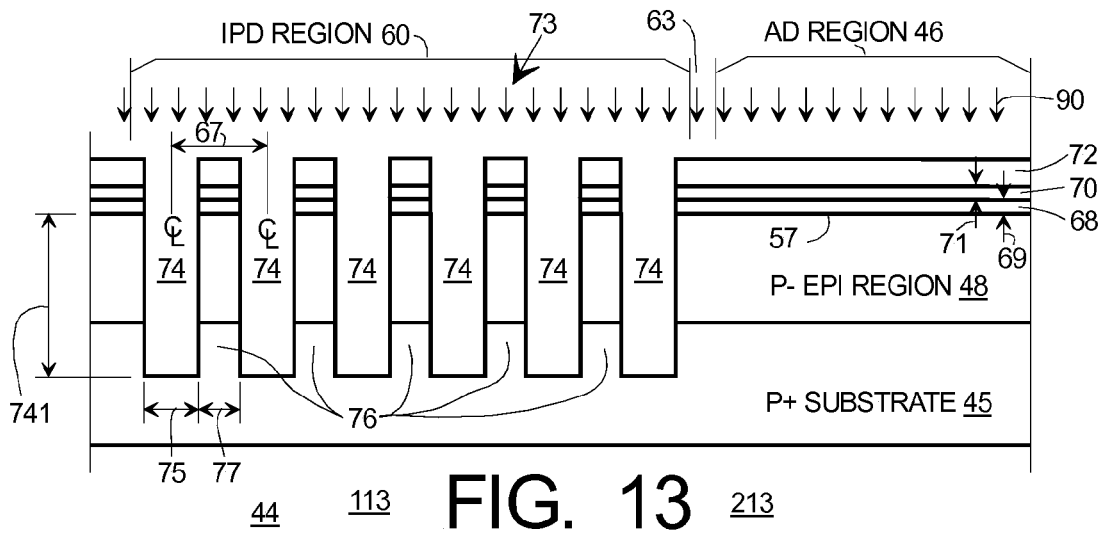

Referring now to manufacturing stage 113 of FIG. 13, etchant 90 that preferentially and anisotropically attacks semiconductor substrate 45 is directed through mask openings 73 to form trenches 74 extending into and/or though epi-layer 48 into substrate 45 to depth 741. Depth 741 is usefully in the range of about 2 to 20 micrometers, more conveniently in the range of about 9 to 20 micrometers and preferably in the range of about 15 to 20 micrometers, but larger and smaller depths can also be used. The choice of etchant 90 depends upon the choice of material for SC substrate 45 and is within the competence of those of skill in the art. For silicon substrate 45, HBr and SiF4 in a helium-oxygen mixture are suitable etchants, but other etch chemistry may also be used. The width and spacing of openings 73 are chosen so as to provide trenches 74 of width 75 separated by columns or pillars 76 of width 77 of SC material of substrate 45. Structure 213 results.

Figure 14:
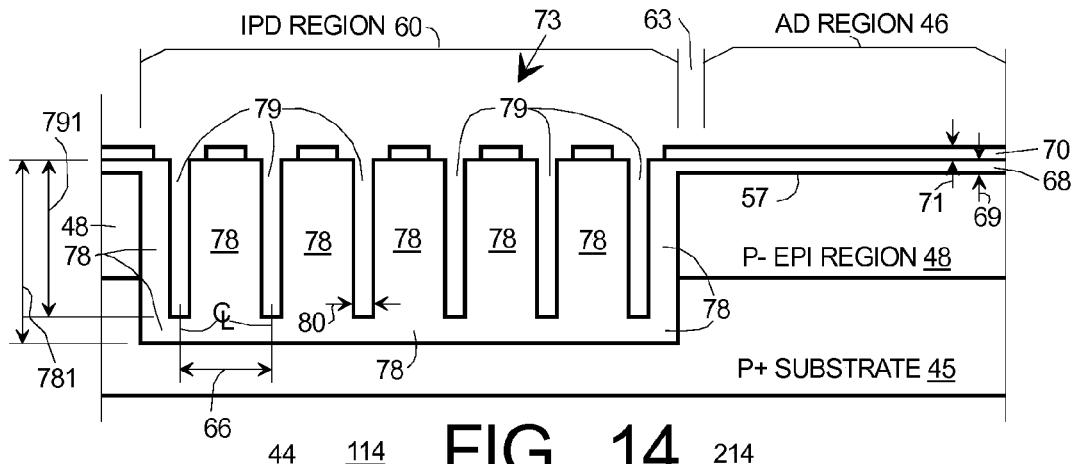

Referring now to manufacturing stage 114 of FIG. 14, hard mask layer 72 shown in FIG. 13 is desirably removed and the semiconductor material exposed in trenches 74 is preferentially converted to dielectric 78. For silicon substrate 45, the resulting dielectric is preferably silicon dioxide. Steam oxidation of silicon substrate 45 is preferred for forming oxide regions 78 from the SC material exposed in trenches 74. Oxidation is carried out in this embodiment until substantially all of the SC material in SC columns or pillars 76 is converted to silicon oxide. The silicon dioxide produced by oxidation of silicon columns or pillars 76 occupies a larger volume than the silicon consumed during oxidation. Thus, trenches 74 become narrower as oxidation proceeds. Trench widths 75 and column widths 77 are chosen (by appropriate selection of initial mask openings 73 and spacing) so that the oxide regions formed by oxidation of columns or pillars 76 do not close, but rather leave empty trenches or voids 79 of width 80 between adjacent oxide columns 78. Width 80 is usefully in the range of about 0.2 to 5.0 micrometers, more conveniently in the range of about 0.2 to 3.0 micrometers and preferably in the range of about 0.3 to 0.7 micrometers, but wider or narrower voids can also be used. By way of example and not intended to be limiting, in order to obtain void trenches 79 of width 80 of about 0.5 micrometers, initial trench widths 75 of about 4.5 micrometers (see FIG. 13) separated by initial substrate column widths 77 of about 2.7 micrometers are used, thereby giving initial trench-to-trench centerline separation 66 of about 7.2 micrometers, assuming that SC columns 76 are fully converted to oxide in manufacturing stage 114. By adjusting initial trench width 75 and column width 77, different widths 80 of residual void trenches 79 can be obtained after SC substrate columns or pillars 76 are fully converted to oxide. Structure 214 results.

Figure 15:
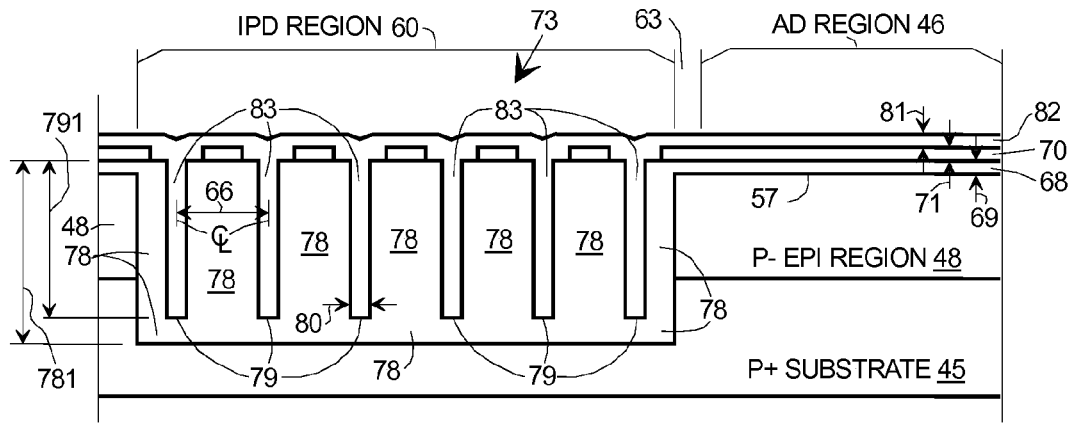

Referring now to manufacturing stage 115 of FIG. 15, polycrystalline or amorphous (i.e., non-single crystal) material 82, as for example poly-silicon, is formed (e.g., by chemical vapor deposition (CVD)) over IPD region 60 to thickness 81 sufficient to fill cavities 79 with semiconductor inclusions 83. Structure 215 results. For convenience of explanation, it is assumed hereafter that layer 82 and inclusions 83 are poly-silicon, but other materials having a thermal expansion coefficient (TEC) less than that of dielectric 78 and/or closer to the TEC of substrate 45 can also be used. Amorphous and/or poly of silicon, germanium and combinations thereof are non-limiting examples of semiconductor materials suitable for use with silicon, germanium or silicon-germanium substrates. These are intended merely as examples and not limitation and other non-semiconductor material having thermal expansion coefficients (TECs) less than that of dielectric 78 and/or more closely matching the TEC of substrate 45 can also be used. Structure 215 results wherein, e.g., poly-silicon inclusions 83 of width 80 are formed in trenches 79 of width 80. By considering FIGS. 3-15 it will be appreciated that inclusions 83 can have a blade-like configuration, that is, their width 80 is generally significantly less than their height 791 and their length in the direction perpendicular to the plane of FIGS. 3 and 12-20 (e.g., as shown by the exemplary plan views presented in FIGS. 4-11). For example, as noted in connection with FIG. 3 and following, CDR 62 preferably has a depth 621, 781 perpendicular to surface 57 of at least about 5-15 micrometers, more preferably equal or larger than about 10-15 micrometers. Inclusions 65 (see FIGS. 3 and 18-20) preferably have width 80 of about 0.3 to 0.7 micrometers and vertical heights in FIGS. 3 and 18-20 generally a few micrometers shorter than depth 621, 781 of CDR 62 (see FIGS. 3 and 14-20) because of the portions of dielectric 78 lying beneath inclusions 65 and portions 85 of dielectric lying above inclusions 65 (see FIG. 18). Thus, inclusions 65 can have aspect ratios, defined as their vertical height divided by their horizontal width 80 (see FIGS. 3 and 18-20), in the range of about 2 to 200, more conveniently about 15-50 and preferably about 20-30, but larger and smaller values can also be used. Their length in the direction perpendicular to the plane of FIGS. 3 and 18-20 can be much larger multiples of width 80 and will depend upon the lateral size of IPDs 35 overlying CDR 62, as can be appreciated by inspecting the plan views presented in FIGS. 4-11. The magnitude of the depths discussed above for depths 621, 781 also apply generally to depths 781', 741" of CDR 62', 62" of FIGS. 23 and 28. The magnitudes of width 80 and the aspect ratios discussed above also apply generally to widths 80', 80" and the aspect ratios of inclusions 65' and 65" of FIGS. 23 and 28.

Figure 16:
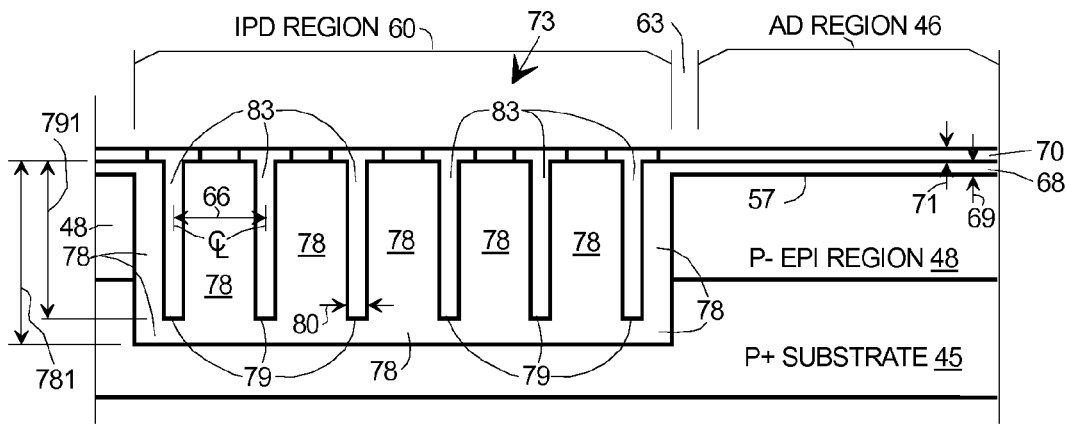

Referring now to manufacturing stage 116 of FIG. 16, the portion of layer 82 shown in FIG. 15 lying above further pad layer 70 is removed leaving, e.g., poly-silicon, inclusions 83 substantially untouched. Any planarization technique can be used. Photoresist coating followed by etching of photoresist and poly silicon (so called resist etch back) is a non-limited example of a suitable planarization process, but other planarization techniques, e.g., chemical-mechanical polishing (CMP), may also be used to remove the excess portion of layer 82 above layer 70. Further pad layer 70 is useful as a planarization etch stop or polishing step and facilitates the planarization process. Structure 216 results.

Figure 17:
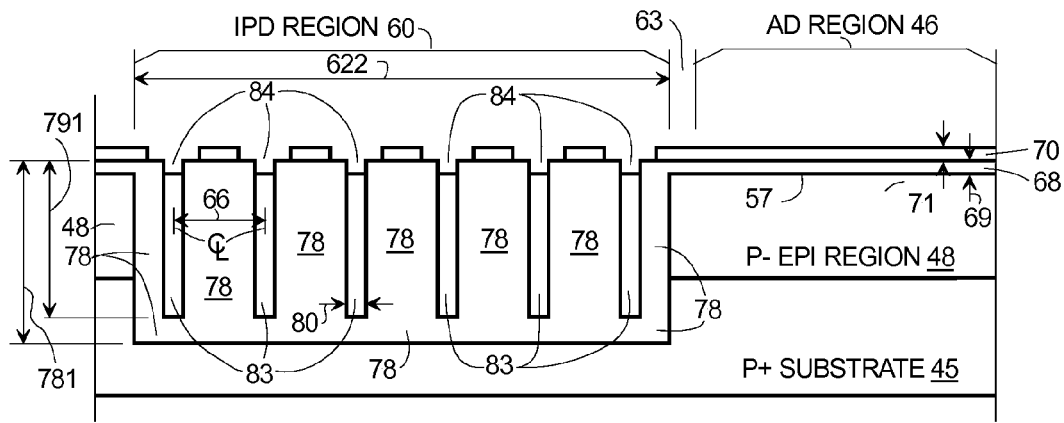

Referring now to manufacturing stage 117 of FIG. 17, portions 84 at the top of poly-silicon inclusions 83 are removed by a brief (e.g., silicon) etch. Removed portions 84 include the tops of inclusions 83 lying in trenches 79 (see FIG. 13) and preferably lying above SC surface 57, but deeper or shallower etching may also be used. The particular etchant used will depend upon the choice of material for inclusions 83 and is within the competence of those of skill in the art. Where inclusions 83 are of poly-silicon, $HBr/Cl_2$ is a suitable etchant but other etchants may also be used. Structure 217 results.

Figure 18:
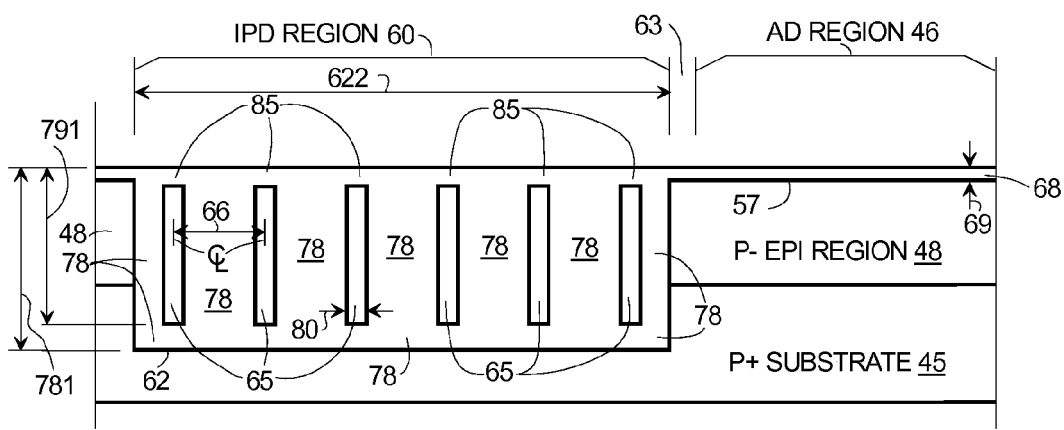

Referring now to manufacturing stage 118 of FIG. 18, the portions of (e.g., poly-silicon) inclusions 83 exposed in manufacturing stage 117 are, for example, oxidized to form dielectric regions 85 above electrically isolated (e.g., poly-silicon) inclusions 65 embedded within dielectric (e.g., silicon oxide) regions 78, thereby forming composite dielectric (isolation) region (CDR) 62 illustrated in FIGS. 3 and 18. CDR 62 has width 622 in the plane of FIG. 18 and depth 781 incorporating electrically isolated (e.g., poly-silicon) inclusions 65. Pad nitride layer 70, is desirably removed. Structure 218 results.

As noted previously in connection with FIG. 16, inclusions 83 (and resulting inclusions 65 of FIGS. 3 and 18-20, 23, 28) have a column-like or blade-like configuration. Referring now to FIG. 3 and following, CDR 62 preferably has a depth 621, 781 of at least about 5 micrometers, more conveniently equal or larger than about 10 micrometers and preferably equal or larger than about 15 micrometers. As has been explained, inclusions 65 (see FIGS. 3 and 18-20) have width 80 usefully in the range of about 0.2 to 5 micrometers, more conveniently about 0.2 to 3.0 micrometers and more preferably about 0.3 to 0.7 micrometers and vertical heights in FIGS. 3 and 18-20, 23, 28 generally a few micrometers shorter than depth 621, 781 of CDR 62 because of the isolating dielectric 78 and 85 lying beneath and above inclusions 65. Thus, inclusions 65 can have aspect ratios (vertical height divided by horizontal width 80 in FIGS. 3 and 18-20 in the range of about 2 to 200, more conveniently about 15-50 and preferably about 20-30, but larger and smaller values can also be used. Their length in the direction perpendicular to the plane of FIGS. 3 and 18-20 (and FIGS. 23, 28) can be much larger multiples of width 80 and will depend upon the lateral size of IPDs 35 overlying CDR 62, as can be appreciated by inspecting the various plan views presented in FIGS. 4-11. The magnitude of the depths discussed above for depths 621, 781 also apply generally to depths 781', 741" of CDR 62', 62" of FIGS. 23 and 28. The magnitudes of width 80 and the aspect ratios discussed above also apply generally to widths 80', 80" and the aspect ratios of inclusions 65' and 65" of FIGS. 23 and 28.

Figure 19:
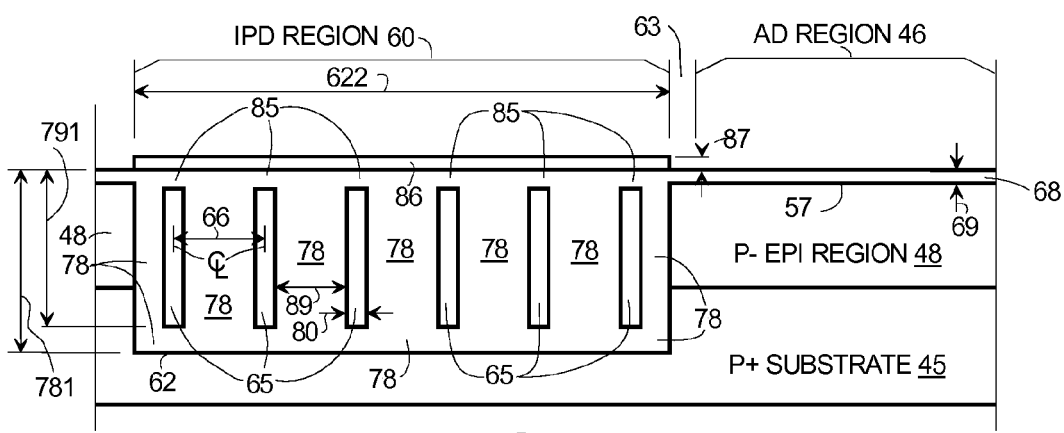

Referring now to manufacturing stage 119 of FIG. 19, further dielectric layer 86, preferably of silicon nitride, and having thickness 87 is formed above composite dielectric region (CDR) 62. Structure 219 results. Referring now to manufacturing stage 120 of FIG. 20, active device 47 is formed in ADR 46 using means well known in the art. In this example, active device 47 is an LDMOS device having source-drain 50, 52 with contacts 51, 53 and gate dielectric 54 with gate 55 overlying channel region 59, but this is merely by way of example and not intended to be limiting and MOS device 24 of FIGS. 1-2 or any other type of active device can equally well be formed in ADR 46, before or during any manufacturing stage 112-120 of FIGS. 12-20. Pad layers 68, 70 and layer 86 are generally incorporated into or replaced by field oxide regions in connection with preparation of active device 24, 47 and are generally ignored in FIG. 20 (and in FIGS. 23, 28), although layer 86 is shown as being incorporated in the upper portion of CDR 62 of FIG. 20 (and in FIGS. 23, 28). IPD 35 is formed above CDR 62 in IPD region 60, conveniently at about the same time as contacts 51, 53 of active device 47 and/or interconnection 41 leading from active device 47 to IPD 35 (see FIGS. 20, 23, 28) are provided, but in other embodiments IPD 35 and interconnection 41 can be formed earlier or later in the manufacturing process. Either sequence is useful. Passivation layer 40 of, for example and not intended to be limiting, silicon oxide, silicon nitride or combinations thereof with or without various stabilization dopants is desirably applied over IPD region 60 and ADR 46. Structure 220 results. Electronic element 44 is then substantially complete. Interconnection 41 between one or more of the device contact regions (e.g., drain contact 53) and IPD 35 is shown schematically in FIG. 20. Persons of skill in the art will understand that such interconnection(s) will depend upon the type of device provided in ADR 46, the type of IPD 35 provided in IPD region 60 and the desired electronic function being implemented in electronic element 44. Persons of skill in the art will also understand that analogous IPDs and interconnections may be coupled to other terminals of active device 47 and that the illustration in FIG. 20 (and FIGS. 23, 28) of IPD 35 being coupled to drain terminal 53 of active device 47 is merely by way of example and not limitation.

Figures 20, 21, 22:
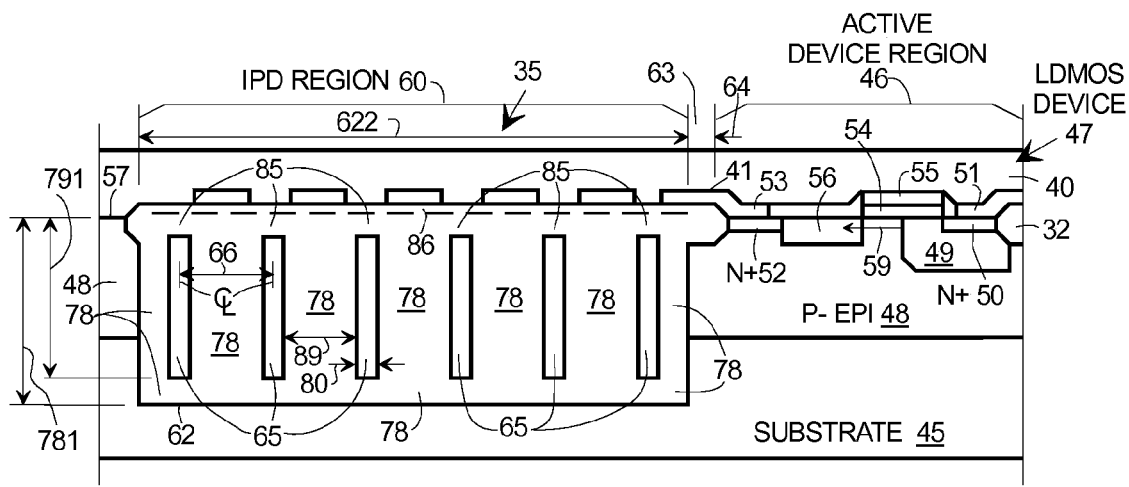
FIGS. 21-23 show cross-sectional views through a semiconductor substrate at different stages of manufacture of the composite dielectric regions (CDRs) of FIGS. 3 and 4-11 adapted to support one or more integrated passive devices (IPDs), according to still yet further embodiments of the present invention.
Figure 23:
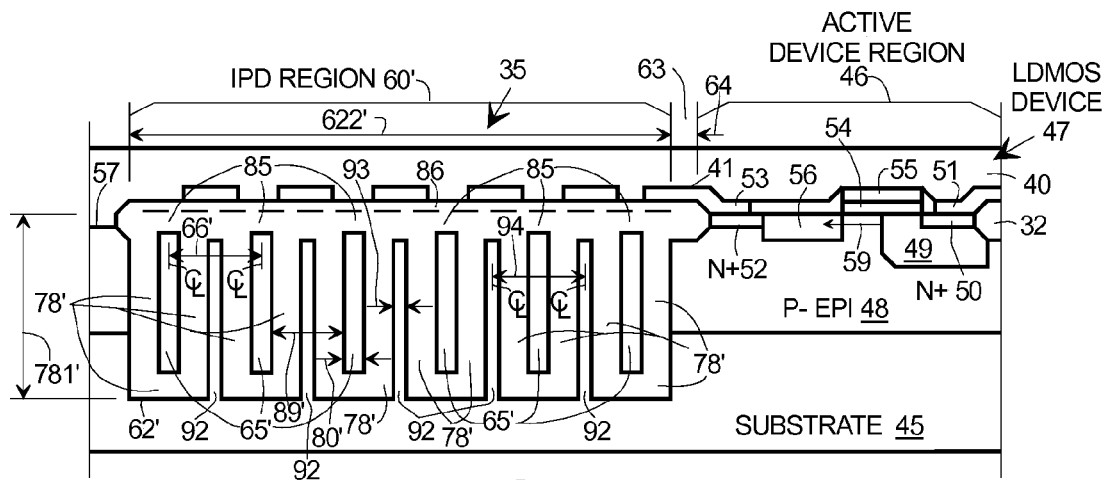

FIGS. 21-23 show cross-sectional views though semiconductor substrate 45 at different stages 121-123 of manufacture of CDR 62 of FIGS. 3 and 4-11 and CDR 62' of FIG. 23 adapted to support one or more integrated passive devices (IPDs) 35, according, to still yet further embodiments of the present invention. In connection with FIGS. 21-23, the convention is adopted of identifying various regions similar to those of FIGS. 12-20 by the same reference numbers and identifying various regions analogous to those of FIGS. 12-20 but which may be different in some aspect(s) by using the same reference numbers supplemented by a prime ('). For example, substrate 45 can be the same and so is identified by the same reference number 45 in FIGS. 21-23 as in FIGS. 12-20, whereas trenches 74' and columns or pillars 76' of FIGS. 21-23 while analogous to trenches 74 and columns or pillars 76 of FIGS. 12-20 may be somewhat different and are, therefore, identified by the same reference numbers with a 0 added.

Manufacturing stage 121 of FIG. 21 yielding structure 221 is analogous to manufacturing stage 113 of FIG. 13 yielding structure 213 and the discussion thereof and preceding manufacturing stage 112 is incorporated herein by reference. What is different in manufacturing stage 121 and structure 221 is that trench widths 75' and column widths 77' are chosen (by means of adjusting mask openings 73') so that in subsequent manufacturing stage 122 of FIG. 22, SC substrate columns 76' are not oxidized to completion as were substrate columns 76 in manufacturing stage 114 of FIG. 14, but SC substrate columns 92 (see FIG. 22) of width 93 are left in place undisturbed and un-oxidized, embedded within oxide regions 78' containing void trenches 79' of width 80'. Widths 80' of FIGS. 22-23 may be the same or different than widths 80 of FIGS. 14-20. As with manufacturing stage 114 of FIG. 14, in manufacturing stage 122 of FIG. 22 trenches 74' become narrower as oxidation proceeds. Trench widths 75' and column widths 77' are chosen (by appropriate selection of initial mask openings 73' and spacing) so that the oxide regions formed by partial oxidation of columns 76' do not close, but rather leave empty trenches or voids 79' of width 80' between adjacent oxide columns 78'. Width 80' is usefully in the range of about 0.2 to 5.0 micrometers, more conveniently in the range of about 0.2 to 3.0 micrometers and preferably in the range of about 0.3 to 0.7 micrometers, but wider or narrower voids can also be used. By way of example and not intended to be limiting, in order to obtain void trenches 79' of width 80' of about 0.5 micro-meters while leaving undisturbed SC substrate columns 92 of widths 93, initial trench widths 75' of about 4.5 micrometers (see FIG. 21) separated by initial substrate column widths 77' of about 3.7 micrometers are used, assuming that oxidation of SC substrate columns or pillars 76' is terminated before they are fully converted to oxide in manufacturing stage 122. By adjusting initial trench width 75' and column width 77' and the oxidation time, different widths 80' of residual void trenches 79' can be obtained after SC substrate columns or pillars 76' are partially converted to oxide while leaving embedded within dielectric regions 78' SC substrate columns 92 of width 93 and spacing 94. Structure 222 results. Structure 222 then proceeds through substantially the same manufacturing stages associated with FIGS. 15-20 and the discussion thereof is incorporated herein by reference. Manufacturing stage 123 of FIG. 23 is analogous to manufacturing stage 120 of FIG. 20 with the difference that residual SC substrate columns 92 of width 93 and spacing 94 are incorporated in CDR 62' of electronic element 44'. The discussion of manufacturing stage 120 of FIG. 20 is incorporated herein by reference. Active device 47 (or 24 or of any other device type) can be formed before, during or after formation of CDR 62' and IPD 35.

Figure 24:
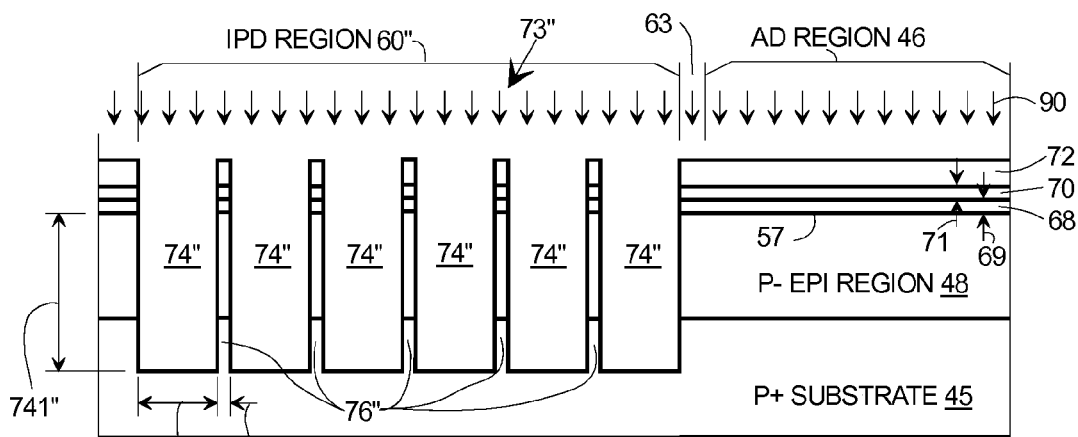
FIGS. 24-28 show cross-sectional views through a semiconductor substrate at different stages of manufacture of the composite dielectric regions (CDRs) of FIGS. 3 and 4-11 adapted to support one or more integrated passive devices (IPDs), according to yet still further embodiments of the present invention.
Figure 25:
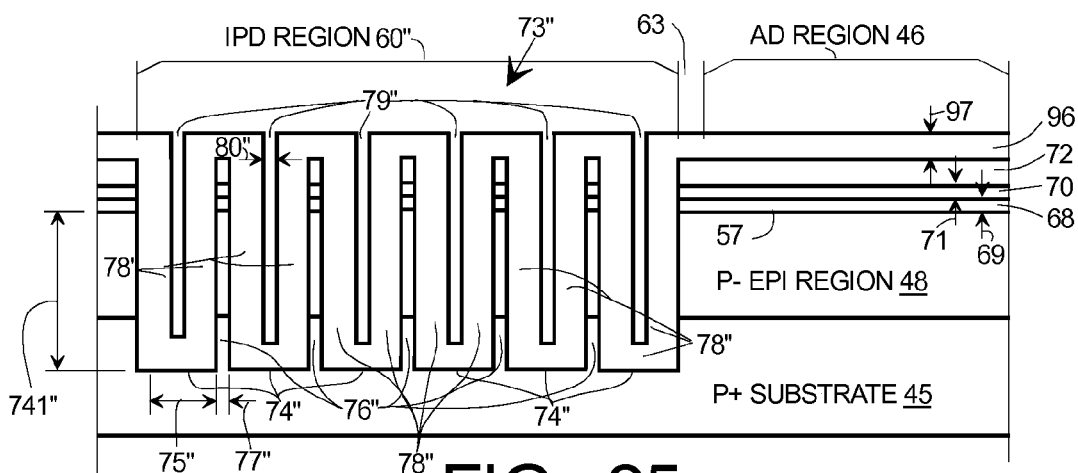
Figure 28:
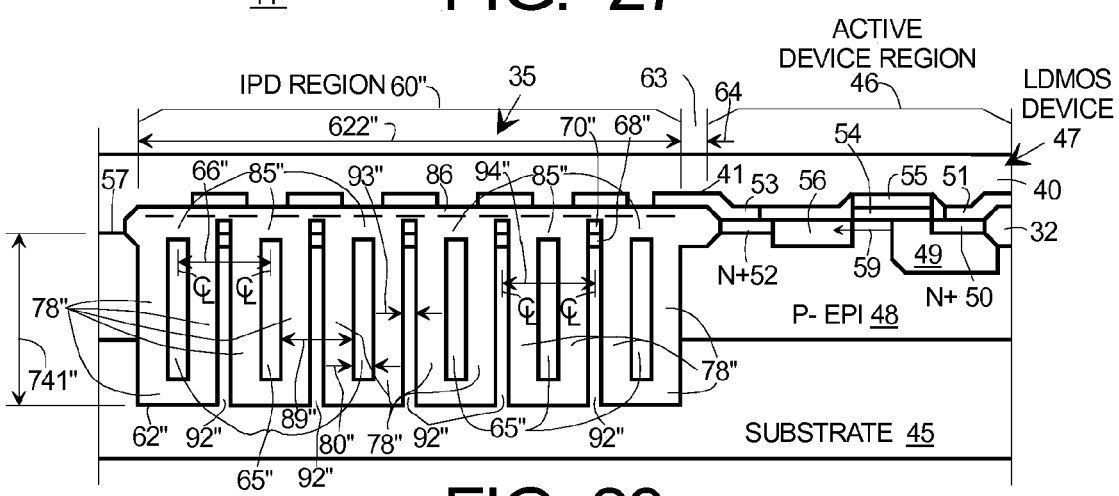

FIGS. 24-28 show cross-sectional views though semiconductor substrate 45 at different stages of manufacture 124-128 of CDR 62 of FIGS. 3 and 4-11 and CDR 62" of FIG. 28 adapted to support one or more integrated passive devices (IPDs) 35, according, to yet still further embodiments of the present invention. In connection with FIGS. 24-28, the convention is adopted of identifying various regions similar to those of FIGS. 12-20 by the same reference numbers and identifying various regions analogous to those of FIGS. 12-20 but which may be different in some aspect(s) by using the same reference numbers supplemented by a double prime ("). For example, substrate 45 can be the same and so is identified by the same reference number 45 in FIGS. 24-28 as in FIGS. 12-20, whereas trenches 74" and columns or pillars 76" of FIGS. 24-28 while analogous to trenches 74 and columns or pillars 76 of FIGS. 12-20 may be somewhat different and are, therefore, identified by the same reference numbers with a (") added. Manufacturing stage 124 of FIG. 24 yielding structure 224 is analogous to manufacturing stage 113 of FIG. 13 yielding structure 213 and the discussion thereof and preceding manufacturing stage 112 is incorporated herein by reference. What is different in manufacturing stage 124 and structure 224 of FIG. 24 is that trench widths 75" and column widths 77" are chosen (by means of adjusting mask openings 73" and their spacing) so that in subsequent manufacturing stage 125 of FIG. 25, dielectric regions 78" and voids 79" are produced by deposition of separate dielectric layer 96 (see FIG. 25) rather than oxidation of substrate columns or pillars 76". Thus, with the process illustrated by manufacturing stages 124-128, any insulating material may be used for dielectric 78". In manufacturing stage 124 of FIG. 24, trenches 74" of widths 75" separated by substrate columns or pillars 76" (including portions of overlying pad layers 68, 70 on top of columns 76") are etched in substrate 45 to depth 741". Structure 224 results. Referring now to manufacturing stage 125 of FIG. 25, dielectric layer 96 of thickness 97 is formed preferably conformally over structure 224. CVD silicon oxide is a suitable material for layer 96; however a wide variety of other dielectric materials may also be used. Also, any CVD process may be used, but deposition employing TEOS is convenient. Thickness 97 is chosen so that layer 96 coats the sidewalls of trenches 74" leaving unfilled voids 79" of width 80" centrally located within trenches 74". Structure 225 results.

Figure 26:
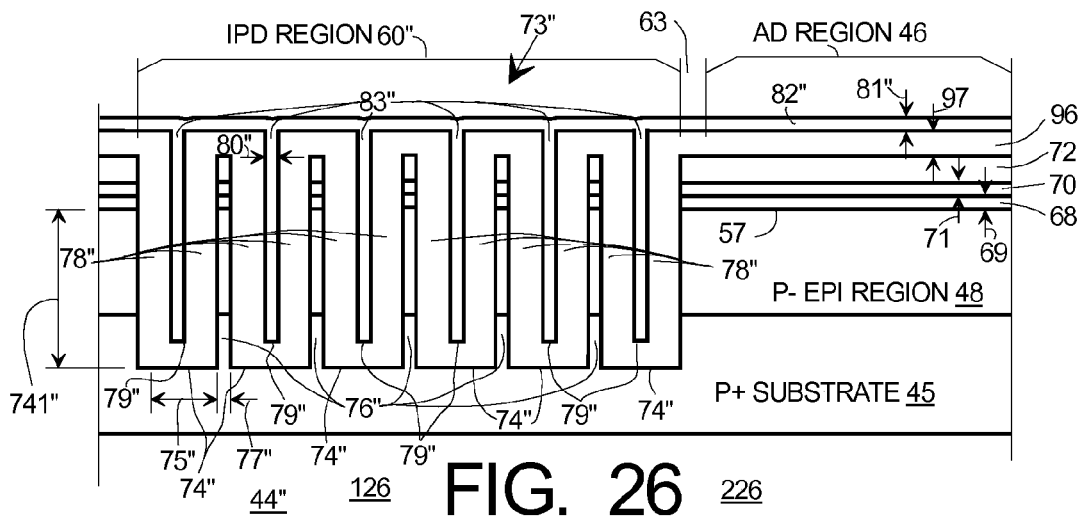
Figure 27:
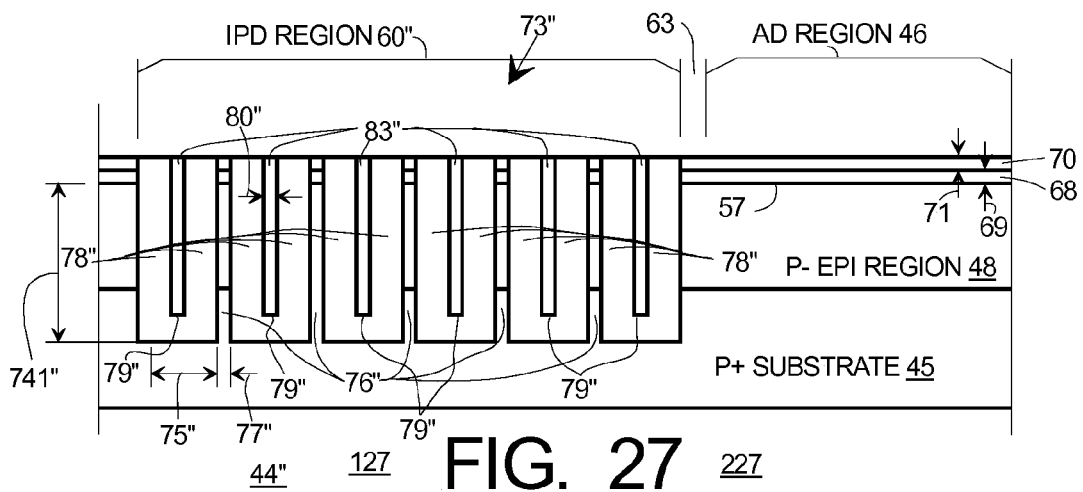

Referring now to manufacturing stage 126 of FIG. 26, layer 82" of thickness 81" analogous to layer 82 of FIG. 15 is formed over structure 225, thereby filling void trenches 74" of width 80" and creating inclusions 83" of width 80" in much the same manner as described for void trenches 74 and inclusions 83 of manufacturing stage 115 of FIG. 15, the discussion of which is incorporated herein by reference. Structure 226 results. While manufacturing stage 126 of FIG. 26 illustrates the situation where mask 72 is left in place during deposition of layer 82", in other embodiments, mask layer 72 may be removed prior to such deposition. Either arrangement or sequence is useful. Referring now to manufacturing stage 127 of FIG. 27, structure 226 is planarized in much the same manner as has been previously described in connection with manufacturing stage 116 of FIG. 16, the discussion of which is hereby incorporated by reference. Structure 227 results. Advantage is taken of the presence of further pad layer 70 which provides a convenient planarization polish stop and/or etch stop. Structure 227 is then subjected to manufacturing stages analogous to manufacturing stages 117-120 of FIGS. 17-20, the discussion of which is incorporated herein by reference, culminating in manufacturing stage 128 of FIG. 28 analogous to manufacturing stage 120 of FIG. 20, with the difference that residual SC substrate columns or pillars 92" of width 93" and center-to-center spacing 94" are incorporated in CDR 62" of electronic element 44". Poly inclusions 65" of width 80" and separation 89" and center-to-center distance 66" are provided in deposited dielectric regions 78" having therein substantially un-oxidized substrate columns 92". Poly-inclusions 65" are electrically floating and residual substrate columns 92" are separated from IPD 35 by at least portions 70" and 68" of pad layers 70, 68 and layer 86, thereby limiting their impact on the E-M coupling field generated by IPD 35. Active device 47 (or 24 or of any other type) can be formed before, during or after formation of CDR 62" and IPD 35.

A particular advantage of the invented embodiments, is that CDR 62, 62', 62" can be formed early in the process flow prior to the principal steps needed for forming the active device(s) in ADR region 46. This means that the device regions need not be exposed to the high temperature steps associated with forming CDR 62, 62', 62". This is a significant manufacturing advantage that can enhance manufacturing yields. Further, the significantly lower mechanical stress obtained with the invented method and structure through use of inclusions 65, 65' 65" in CDR 62, 62', 62" provides substantially improved manufacturing yields. A further advantage provided by the low stress character of the invented method and structure is that much larger IPD areas can be incorporated in the electronic elements, for example, as much as 5% to 20% of the overall chip area, whereas prior arrangements employing, for example, DDR 36' of FIG. 2 without inclusions 65, 65', 65" have generally been limited to less than 5% of the overall area, typically 2-3%. The reason for this is that the overall mechanical stress depends not only on the TEC mis-match between DDR 36' and substrate 21, but on the percentage of the chip area that is occupied by DDR 36'. The greater the relative area of DDR 36' the greater the overall stress and in order to limit the overall stress to tolerable levels, it is usually necessary to severely limit the percentage of chip area occupied by DDR 36', and therefore IPDs 35 on DDRs 36'. In contrast, with CDR 62, 62', 62" of the present invention, the overall mechanical stress is much reduced so that a larger percentage of the chip area may be devoted to CDRs 62, 62', 62" and IPDs 35 placed thereon. A still further advantage of the low stress character of the present method and structure is that IPD CDRs 62, 62', 62" (with IPDs 35 thereon) can be placed closer to active device region 46, e.g., with distance 64 of transition region 63 usefully less than or equal to about 100 micrometers, more conveniently less than or equal to about 50 micrometers and preferably as close as about 20 micrometers, whereas with prior art DDR 36' without inclusions 65, 65', 65" described herein, it has generally been necessary to keep IPD regions 34' at least about 100 to 200 micrometers away from active device regions 22 depending on the percentage of total area occupied by IPD regions 34', the larger the area percentage occupied by IPD regions 34', the further away they must be located from ADR 22 to reduce undesirable stress effects to tolerable levels. This can cause undesirable area bloat when employing DDRs 36' of FIG. 2.

According to a first embodiment, there is provided a method (112-128) for forming an electronic element (44, 44', 44") incorporating an integrated passive device (IPD) (35) and an active device (24, 47), comprising, providing (112, 121, 124) a substrate (45) of a first material having a first thermal expansion coefficient (TEC) and having a first surface (57), wherein the substrate (45) has therein a first portion (46) adapted to receive the active device (24, 47) and a second portion (60) adapted to receive the IPD (35), forming (112, 121, 124) a mask (72) on the second portion (60), the mask having spaced-apart openings (73, 73', 73") of a first width (75, 75', 75"), etching spaced-apart trenches (74, 74', 74") of substantially the first width (75, 75', 75") to a first depth (741, 741") in the substrate (45), leaving columns (76, 76', 76") of substantially undisturbed substrate (45) material between the trenches (74, 74', 74") and other portions of the substrate (45) material beneath the trenches (74, 74', 74"), forming dielectric (78, 78', 78") having a second TEC in the trenches (74, 74', 74") so that a substantially centrally located void (79, 79', 79") is present in the dielectric (78, 78', 78") extending from the first surface (57) into the trenches (74, 74', 74") but not in contact with the other portions of the substrate (45) material beneath the trenches (74, 74', 74"), filling the trenches (74, 74', 74") with inclusions (65, 65', 65") electrically floating with respect to the substrate (45) and having a third TEC less than the second TEC, and forming the IPD device (35) above the dielectric (78, 78', 78") and the inclusions (65, 65', 65"), so as to be electrically isolated from the inclusions (65, 65', 65"). According to a further embodiment, the dielectric forming step, comprises oxidation of the columns (76, 76', 76"). According to a still further embodiment, the oxidation of the columns (76, 76', 76"), comprises substantially complete oxidation of the columns (76, 76', 76"). According to a yet further embodiment, the oxidation of the columns (76, 76', 76"), comprises incomplete oxidation of the columns (76, 76', 76"). According to a still yet further embodiment, the substrate (45) comprises a semiconductor and the inclusions (65, 65', 65") comprise a polycrystalline or amorphous form of the same semiconductor. According to a yet still further embodiment, the inclusions (65, 65', 65") comprise silicon, germanium or a combination thereof. According to another embodiment, the step of forming the dielectric (78, 78', 78") comprises depositing a dielectric material (82"). According to a till another embodiment, the inclusions (65, 65', 65") have a width (80, 80', 80") in the range of about 0.2 to 5 micrometers. According to a yet another embodiment, the inclusions (65, 65', 65") have a width (80, 80', 80") in the range of about 0.2 to 3 micrometers. According to a still yet another embodiment, the inclusions (65, 65', 65") have a width (80, 80', 80") in the range of about 0.2 to 0.7 micrometers. According to a yet still another embodiment, the inclusions (65, 65', 65") have a blade-like shape.

According to a second embodiment, there is provided an electronic assembly (44, 44', 44"), comprising, a semiconductor (SC) substrate (45) having a first thermal expansion coefficient (TEC) and an active device region (46) and an integrated passive device (IPD) region (60), an integrated passive device (IPD) (35) located in the IPD region (60), a region of an insulating material (78, 78', 78") having a second TEC, located in the IPD region (60) and adapted to support the IPD (35), and inclusions (65, 65', 65") of a further material (82) within the region of insulating material (78, 78', 78") thereby forming a composite dielectric region (62, 62', 62"), wherein the further material (82) has a third TEC less than the second TEC, and wherein the inclusions (65, 65', 65") are electrically isolated from the substrate (45) and the IPD (35). According to a further embodiment, the inclusions have a width (80, 80', 80") in the range of about 0.2 to 5 micrometers. According to a still further embodiment, the inclusions (65, 65', 65") have an aspect ratio in the range of about 2 to 200. According to a yet further embodiment, the substrate (45) comprises silicon, germanium or a combination thereof and the inclusions (65, 65', 65") comprise silicon, germanium or a combination thereof. According to a still yet further embodiment, the inclusions (65, 65', 65") comprise, in plan view, parallel rows of inclusions (65-1, 65-2). According to a yet still further embodiment, the inclusions (65, 65', 65") comprise in plan view, concentric shapes of inclusions (65-6, 65-7, 65-8). According to another embodiment, the inclusions (65, 65', 65") comprise in plan view, staggered rows of inclusions (65-3) or "L" or "T" shaped inclusions (65-4), or an X-Y matrix of inclusions (65-5).

According to a third embodiment, there is provided an electronic assembly (44, 44', 44"), comprising, a semiconductor substrate (45) comprising silicon, with an active device region (46) and an integrated passive device (IPD) region (60) thereon, a composite dielectric region (62, 62', 62") located in the IPD region (60), comprising silicon oxide regions (78, 78', 78") with electrically isolated polysilicon or amorphous silicon inclusions (65, 65', 65") therein, an integrated passive device (IPD) (35) located above the composite dielectric region (62, 62', 62") in the IPD region (60), and an active device (24, 47) located in the active device region (46) and electrically coupled to the IPD (35). According to a further embodiment, the IPD region (60) and the active device region (46) are laterally separated by less than 100 micrometers. According to a still further embodiment, the IPD region (60) and the active device region (46) are laterally separated by less than about 50 micrometers. According to a yet further embodiment, the IPD region (60) and the active device region (46) are laterally separated by less than about 20 micrometers. According to a still yet further embodiment, the active device (47) is an LDMOS device. According to a yet still further embodiment, the active device (24) is a MOSFET.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic assembly, comprising:
a semiconductor (SC) substrate having a first thermal expansion coefficient (TEC) and an active device region and an integrated passive device (IPD) region;
an integrated passive device (IPD) located in the IPD region;
a region of an insulating material having a second TEC, located in the IPD region and adapted to support the IPD; and
solid inclusions of a further material within the region of insulating material the wherein the further material has a third TEC less than the second TEC, wherein the inclusions are electrically isolated from the substrate and the IPD, wherein the inclusions are filled trenches formed within the region of insulating material, and wherein additional dielectric material is formed over the filled trenches to produce a composite dielectric region underlying the IPD.

2. The electronic assembly of claim 1, wherein the inclusions have a width in a range of about 0.2 to 5 micrometers.

3. The electronic assembly of claim 1, wherein the inclusions have an aspect ratio in a range of about 2 to 200.

4. The electronic assembly of claim 1, wherein the substrate comprises silicon, germanium or a combination thereof, and the inclusions comprise silicon, germanium or a combination thereof.

5. The electronic assembly of claim 1, wherein the inclusions comprise, in plan view, parallel rows of inclusions.

6. The electronic assembly of claim 1, wherein the inclusions comprise, in plan view, concentric shapes of inclusions.

7. The electronic assembly of claim 1, wherein the inclusions comprise, in plan view, staggered rows of inclusions or "L" or "T" shaped inclusions, or an X-Y matrix of inclusions.

8. The electronic assembly of claim 1, further comprising:
an active device located in the active device region and electrically coupled to the IPD.

9. The assembly of claim 8, wherein the IPD region and the active device region are laterally separated by less than about 100 micrometers.

10. The assembly of claim 9, wherein the IPD region and the active device region are laterally separated by less than about 50 micrometers.

11. The assembly of claim 10, wherein the IPD region and the active device region are laterally separated by less than about 20 micrometers.

12. The assembly of claim 8, wherein the active device is an LDMOS device.

13. The assembly of claim 8, wherein the active device is a MOSFET.

14. An electronic element incorporating an integrated passive device (IPD) and an active device, comprising:
a substrate of a first material having a first thermal expansion coefficient (TEC) and having a first surface, wherein the substrate has therein a first portion adapted to receive the active device and a second portion adapted to receive the IPD;
spaced-apart trenches of substantially a first width and a first depth in the substrate;
columns of substantially undisturbed substrate material between the trenches and other portions of the substrate material beneath the trenches;
dielectric having a second TEC formed in the trenches, wherein a substantially centrally located void is present in the dielectric extending from the first surface into the trenches but not in contact with the other portions of the substrate material beneath the trenches;
solid inclusions filling the trenches, wherein the solid inclusions are electrically floating with respect to the substrate and the solid inclusions have a third TEC less than the second TEC;
additional dielectric formed over the inclusions; and
the IPD formed above the dielectric, the additional dielectric, and the inclusions, wherein the IPD is electrically isolated from the inclusions.

15. The electronic element of claim 14, wherein the substrate comprises a semiconductor, and the inclusions comprise a polycrystalline or amorphous form of the same semiconductor.

16. The electronic element of claim 15, wherein the inclusions comprise silicon, germanium or a combination thereof.

17. The electronic element of claim 14, wherein the inclusions have a width in a range of about 0.2 to 5 micrometers.

18. The electronic element of claim 17, wherein the inclusions have a width in a range of about 0.2 to 3 micrometers.

19. The electronic element of claim 18, wherein the inclusions have a width in the range of about 0.2 to 0.7 micrometers.

20. The electronic element of claim 14, wherein the inclusions have a blade-like shape.

* * * * *

UNITED STATES PATENT AND TRADEMARK OFFICE
CERTIFICATE OF CORRECTION

PATENT NO.         : 8,283,748 B2
APPLICATION NO.    : 13/277847
DATED              : October 9, 2012
INVENTOR(S)        : Xiaowei Ren It is certified that error appears in the above-identified patent and that said Letters Patent is hereby corrected as shown below:

In the Claims:

Column 15, in Claim 1, Line 18, please remove the first "the". It should read as "insulating material wherein the further material".

Signed and Sealed this
Fifth Day of March, 2013

Teresa Stanek Rea
*Acting Director of the United States Patent and Trademark Office*